INVENTOR,
OTTO E. RITTENBACH.
BY Harry M. Saragovitz,
Edward J. Kelly, Herbert Berl
& Julian C. Keppler
ATTORNEYS

3,349,350
FREQUENCY STEP FILTER

Otto E. Rittenbach, 17 Jumping Brook Drive, Neptune, N.J. 07753

Filed Dec. 4, 1964, Ser. No. 416,174
3 Claims. (Cl. 334—47)

Figures 1, 2:
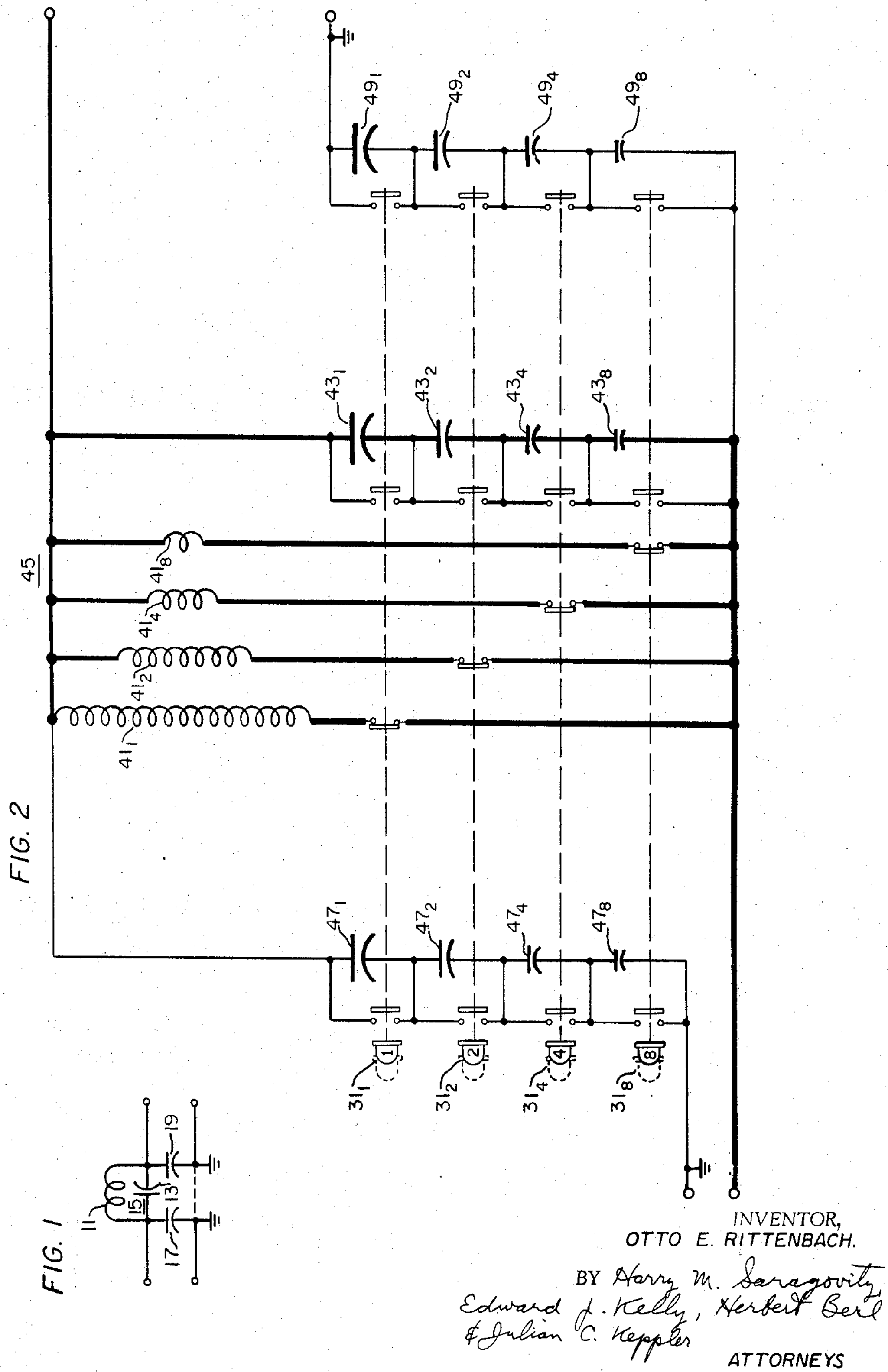

The invention may be manufactured and used by or for the Government for governmental purposes without the payment of any royalty thereon.

This invention relates to inductance and capacitance tuned circuits which can be step adjusted for resonance over a wide range of substantially equally spaced frequencies with uniform reactance (and susceptance) of the inductance and capacitance component portions at each such resonance frequency. The particular arrangement provides a maximum number of frequency steps by use of a minimum number of inductors and capacitors, providing uniform steps with very simple switching. Such circuits may be used as tank circuits of oscillators, or for other purposes. When used as the in-line portion of an L, T, or II section filter the additional cross-line portions can be adjusted in an analogous manner for proper proportioning of the additional component values. The terms "In-line" and "Cross-line" are used rather than series and parallel (or shunt) to avoid confusion with other aspects of the series or parallel connection of inductors and capacitors to be pointed out below.

Step adjusted filters in the past have relied on switching of the entire tank circuits, or sometimes either inductors or capacitors. However, the non-linear relation of frequency to either such inductor or capacitor values has precluded the adjustment of prior such devices in uniform frequency steps, except by using entirely separate tank circuits for each step. In the present invention entire tank circuits are switched, but without requiring a separate tank circuit for each step, that is, capacitors are connected in series each controlled by a shunting switch, and inductors in parallel each controlled by a switch in the usual series relation. In this manner the steps can most readily be made uniform.

If one desired equal steps in period or wavelength (reciprocally related to frequency) it would merely be necessary to use the reciprocal relation, connecting capacitors in parallel and inductors in series. This merely represents an alternative scale based on frequency, but in one case linear and in the other case hyperbolic. In each case the reactance of one component identified by a particular scale value, and the susceptance of the other such component, are each proportional to the actual operating value in terms of the scale. For proper operation at a value corresponding to the sum of the several scale designations, the former must be connected in parallel and the latter in series.

The invention will be further explained in connection with the accompanying drawings, in which:

FIG. 1 indicates a typical prior art Pi-section filter; and

FIG. 2 indicates the present invention applied to a Pi-section filter.

The circuit of FIG. 1 includes the in-line inductor 11 and capacitor 13 comprising tuned tank circuit 15, and the two cross-line capacitor portions 17 and 19. With the in-line components parallel connected as shown, this portion of the filter would have a band-rejection characteristic. For a band-pass characteristic these components would be series connected. Many other variations for special purposes are well known in the art. The present invention is also applicable to such variations.

The circuit of FIG. 2 includes corresponding portions, each component of several alternative sizes identified by subscripts for the relative resonant frequencies represented. In this case the inductors $41_1$ to $41_8$ and capacitors $43_1$ to $43_8$ provide the tank circuit 45, and there may be two sets of cross-line capacitors $47_1$ to $47_8$ and $49_1$ to $49_8$. The cross-line groups 47 and 49 would normally be alike, and within each group the relative values would be proportioned as in group 43; however, the actual values might be very different from those in group 43. To avoid abstractness, yet have convenient numerical values for illustrating the operation, the resonant frequencies may be assumed to be expressed in kilocycles, kc., and the reactances may be considered as 100 ohm (susceptances 0.01 mho) at the corresponding frequencies. A particular set of inductors and capacitors is connected by operation of one of push keys $31_1$ to $31_8$. Each key is arranged to short out the series capacitors and open the parallel circuits of the inductors when not in operated condition, but to open the shorts on capacitors and connect the inductors when in operated condition, thus making these components effective.

The reference frequencies are shown arranged in the usual binary progression, 1, 2, 4, 8, etc., so that by permutation of their selection by push keys all sums from zero (or usefully 1) to 15 are available. Thus only $n$ capacitors, inductors, and their switches can provide for control of a constant impedance tank circuit operable at $2^n-1$ equally spaced resonant frequencies. Frequently, a few of the lowest such frequencies would not be in the range of operation of associated equipment, but a large number of usable stepped frequencies can be obtained from a small number of capacitors and inductors. A binary coded decimal system would be only slightly less economical of components than binary and might be justified for some uses. It may help to consider a few codes discussed in Negative Bit-Weight Codes and Excess Codes, B. Lippel, IEEE Transactions on Electronic Computers, vol. EC-13, No. 3, June 1964. The usual non-binary decimal system would be still less economical, but more convenient for those operators not familiar with binary systems.

Since the reactance of individual inductors is directly proportional to frequency, susceptance is inversely proportional to frequency, susceptance of parallel inductors can be merely added, etc., and similar but inverse relations exist in the capacitor circuits, the various inversions become rather confusing. To minimize such confusion the numerical relations can best be summarized in tabular form, showing the values for several typical frequencies. The table shows the proper single components having 100 ohm reactance (or equivalent 0.01 mho susceptance) at the resonant frequencies of the basic tank circuits, individually 1, 2, 4, and 8 kc. and the combinations of several components having the same reactance at the resonant frequencies 3, 12, and 15 kc. corresponding to the sums of certain basic frequencies. The other eight combinations not expressly shown will be readily apparent from the logical arrangement of the table. The actual capacitance in microfarads and inductance in millihenries could be readily calculated. However, the reactance and susceptance values shown in the table are more readily manipulated, and avoid the need to consider the factor II involved (1) in the relation between frequency expressed in cycles or radians, and (2) therefore in the relation of frequency, reactance value, and usual measuring units of the reactive elements. Similarly, the characteristic impedance of the circuit could be readily calculated, showing that this property also is held contsant in the present circuit when set for any resonant frequency.

ILLUSTRATIVE RESONANT FREQUENCIES

| Frequency, KC | 1 | 2 | 3 (1+2) | 4 | 8 | 12 (4+8) | 15(1+2+4+8) |
|---|---|---|---|---|---|---|---|
| Susceptance, $S_L$, $mho_L$: | | | | | | | |
| $41_1$ | (.01) | .005 | (.0033) | .0025 | .00125 | .00083 | (.00066) |
| $41_2$ | .02 | (.01) | (.0066) | .005 | .0025 | .00166 | (.00133) |
| $41_4$ | .04 | .02 | .0133 | (.01) | .005 | (.00333) | (.00266) |
| $41_8$ | .08 | .04 | .0266 | .02 | (.01) | (.00666) | (.00533) |
| Reactance, Xc, $ohm_C$: | | | | | | | |
| $43_1$ | (100) | 50 | (33) | 25 | 12.5 | 8.3 | (6.66) |
| $43_2$ | 200 | (100) | (66) | 50 | 25 | 16.6 | (13.33) |
| $43_4$ | 400 | 200 | 133 | (100) | 50 | (33.3) | (26.66) |
| $43_8$ | 800 | 400 | 266 | 200 | (100) | (66.6) | (53.33) |

It is now apparent that by merely operating a set of keys, whose values add to a particular frequency, the capacitive and inductive reactances are made equal and the circuits are resonant at such frequency. Alternatively the operation can be arranged on the basis of period or wavelength.

Many variations from this particular form of the invention and other uses will be readily apparent to those skilled in the art.

What is claimed is:

1. A tuned circuit system comprising a like plurality of capacitive and inductive reactance components of binary progressively stepped values,
   arranged in pairs of corresponding reactance and susceptance at similarly progressively stepped values of resonant frequency,
   said inductive components being connected in parallel for use as one inductive reactance of a tuned circuit, but with switches in series with each,
   and said capacitive components being connected in series for use as a capacitive reactance of said tuned circuit, but with switches in shunt with each,
   means to control said switches to connect said pairs individually for resonant operation at one of said stepped frequency values,
   or in combination for resonant operation at a frequency value corresponding to the sum of the individual frequency values of the pairs so connected,
   whereby $n$ capacitances and inductances can be used to provide a circuit tunable to $2^n-1$ frequency values variable in substantially equal steps.

2. A tuned circuit system comprising a like plurality of capacitive and inductive reactance components of mathematically progressively stepped values,
   arranged in pairs of corresponding reactance and susceptance at similarly progressively stepped values of resonant frequency,
   said inductive components being connected in parallel for use as an inductive reactance of a tuned circuit, but with switches in series with each,
   and said capacitive components being connected in series for use as a capacitive reactance of said tuned circuit, but with switches in shunt with each,
   means to control said switches to connect said pairs individually for resonant operation at one of said stepped frequency values,
   or in combination for resonant operation at a frequency value corresponding to the sum of the individual frequency values of the pairs so connected,
   whereby a small number of capacitances and inductances can be used to provide a circuit tunable to a large number of frequency values variable in substantially equal steps.

3. A tuned circuit system comprising a like plurality of capacitive and inductive reactance components of mathematically progressively stepped values,
   arranged in pairs of corresponding reactance and susceptance at similarly progressively stepped values of a scale related to resonant frequency,
   said components whose reactance value is directly proportional to the actual operating value in terms of the scale being connected in parallel for use as one reactance of a tuned circuit, but with switches in series with each,
   and said other components being connected in series for use as the other reactance of said tuned circuit, but with switches in shunt with each,
   means to control said switches to connect said pairs individually for resonant operation at one of said stepped scale value,
   or in combination for resonant operation at a scale value corresponding to the sum of the individual scale value of the pairs so connected,
   whereby a small number of capacitances and inductances can be used to provide a circuit tunable to a large number of scale values variable in substantially equal steps.

No references cited.

HERMAN KARL SAALBACH, *Primary Examiner*.

W. H. PUNTER, *Assistant Examiner*.